(12) United States Patent
Iyer

(10) Patent No.: US 6,777,346 B2
(45) Date of Patent: *Aug. 17, 2004

(54) PLANARIZATION USING PLASMA OXIDIZED AMORPHOUS SILICON

(75) Inventor: Ravi Iyer, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/059,865

(22) Filed: Apr. 14, 1998

(65) Prior Publication Data

US 2003/0143862 A1 Jul. 31, 2003

Related U.S. Application Data

(63) Continuation of application No. 08/599,675, filed on Feb. 12, 1996, now Pat. No. 5,872,052.

(51) Int. Cl.$^7$ .............................................. H01L 21/31
(52) U.S. Cl. ...................... 438/770; 438/303; 438/430; 438/772; 438/775; 438/777
(58) Field of Search ................................ 438/622, 624, 438/635, 424, 430, 485, 772, 775–777, 770–771, 431

(56) References Cited

U.S. PATENT DOCUMENTS

| | | | |
|---|---|---|---|
| 4,323,589 A | 4/1982 | Ray et al. ...................... 427/38 |
| 4,408,387 A | 10/1983 | Kiriseko ....................... 29/576 |
| 4,527,325 A | 7/1985 | Geipel, Jr. et al. ............. 29/571 |
| 4,576,829 A | 3/1986 | Kaganowicz et al. ......... 427/39 |
| 4,604,304 A | 8/1986 | Faraone et al. ............... 427/255 |
| 5,026,665 A | 6/1991 | Zdebel ......................... 437/191 |
| 5,043,224 A | 8/1991 | Jaccodine et al. ........... 428/446 |
| 5,182,221 A | 1/1993 | Sato ............................ 437/67 |
| 5,310,720 A | 5/1994 | Shin et al. .................... 437/231 |
| 5,330,935 A | 7/1994 | Dobuzinsky et al. ........ 437/239 |
| 5,384,288 A | 1/1995 | Ying ............................ 437/228 |
| 5,387,539 A | 2/1995 | Yang et al. .................... 437/67 |
| 5,391,508 A * | 2/1995 | Matsuoka et al. ........... 438/302 |
| 5,438,016 A | 8/1995 | Figura et al. .................. 437/67 |
| 5,466,637 A * | 11/1995 | Kim ............................ 438/396 |
| 5,472,904 A | 12/1995 | Figura et al. .................. 437/67 |
| 5,508,209 A | 4/1996 | Zhang et al. .................. 437/21 |
| 5,567,638 A | 10/1996 | Lin et al. ....................... 437/46 |

FOREIGN PATENT DOCUMENTS

| | | | | |
|---|---|---|---|---|
| JP | 60-70740 | | 4/1985 | ........... H01L/21/76 |
| JP | 2-114641 | * | 4/1990 | |
| JP | 06295888 | * | 10/1994 | ......... H01L/21/302 |

OTHER PUBLICATIONS

Badih El–Kareh, "Fundamentals of Semiconductor Processing Technology," Kluwer Academic Publishers—Boston, pp. 128–129.

* cited by examiner

Primary Examiner—Thanh Nguyen
(74) Attorney, Agent, or Firm—Fletcher Yoder

(57) ABSTRACT

A planarization process for filling spaces between patterned metal features formed over a surface of a semiconductor substrate. The patterned metal features are preferably coated with a dielectric barrier. The dielectric barrier is coated with an material that expands during oxidation or nitridization to a thickness about half the depth of the space between metallized features. The layer is then plasma oxidized using an RF or ECR plasma at low temperature with an oxygen ambient. Alternatively, the layer is plasma nitridized at low temperature. The plasma oxidation or nitridization is continued until the expandable material is converted to a dielectric and has expanded to fill the space between patterned metal features. Optionally, the process can be followed by a mechanical or chemical mechanical planarization step.

12 Claims, 2 Drawing Sheets

PLANARIZATION USING PLASMA OXIDIZED AMORPHOUS SILICON

This application is a Continuation of application Ser. No. 08/599,675 filed Feb. 12, 1996 now U.S. Pat. No. 5,872,052.

BACKGROUND OF THE INVENTION

1. Field of the Invention

The present invention relates, in general, to planarization methods and, more particularly, to a method and apparatus for filling gaps between metal lines in multilayer metallization structures.

2. Statement of the Problem

Integrated circuit technology has advanced through continuing improvements in photolithographic processing so that smaller and smaller features can be patterned onto the surface of the substrate. Spaces or gaps exist between these patterned features. Integrated circuit surfaces also contain trench or via structures protruding down into the surface. The lateral dimensions of such structures is hereinafter referred to as the width of the gap trench or via: the vertical dimension of such structures is referred to as the depth. The aspect ratio is the ratio of the depth to width. The smaller features, with smaller spaces between features, result in high aspect ratio gaps, trenches and vias. These high aspect ratio structures must be filled with an appropriate material before continued processing. This problem is acute in the case of multilayer metal (MLM) designs. In MLM designs each metal layer must be planarized by filling the gaps between metal features with dielectric before a subsequent metal layer can be formed and patterned.

When a deposited film is used to completely fill the high aspect ratio structure three different results can emerge. In one case, the deposited material fills the trench without leaving a seam or void. In a second case, a seam arises from the point where the sidewall layers merge during deposition. In a third case, a void arises if the deposition produces re-entrant profiles at earlier stages of the filling process. The first creates the highest reliability integrated circuits. The seams and voids are undesirable because chemicals or materials may be present in the seam or void to corrode or degrade the structure. Further, voids are rarely hermetically sealed, so subsequent exposure to chemicals or materials deposition can alter the material structure substantially.

Deposition onto patterned features is practiced at several stages and fabrication of semiconductor devices in integrated circuits. Most often the objective is to provide a highly conformal film or a void-free fill. Low pressure chemical vapor deposition (LPCVD) and plasma enhanced chemical vapor deposition (PECVD) are widely used to provide conformal deposition of thin films over three dimensional features. A number of CVD films are currently used in various steps in processing. Typically, sidewall coverage is not uniform along the height of a trench or a via. Low temperature plasma-enhanced deposition and etching techniques are used to form diverse materials including dielectric films such as silicon nitride and silicon dioxide and semiconductor films such as amorphous and polycrystalline silicon. The plasma used in the plasma-enhanced CVD process is a low pressure plasma that is developed in a radio frequency (RF) field. The RF plasma results in a very high electron temperature making possible the deposition of dense, good quality films at lower temperatures and faster deposition rates than are typically possible using purely thermally activated CVD processes.

Current CVD processes have important limitations. With high integration levels, higher aspect ratios are required, stretching the ability of known CVD processes. Seams and voids all endanger the manufacturability of semiconductor product due to the yield and reliability problems they present. Where higher growth temperatures improve conformality or profiles, other properties of the three dimensional structure may be degraded (i.e. abrupt doping profiles due to diffusion). Further, higher growth temperatures cannot be used after metallization.

Planarization processes are particularly difficult after metallization is applied to an integrated circuit. All processes subsequent to metal deposition must be performed at sufficiently low temperature such that the metal does not melt or vaporize. Conventionally this has limited post metallization processing to thin film deposition together with patterning or polishing those thin films. Oxidation processes are almost entirely unused after metal deposition.

Step coverage and filling of high aspect ratio gaps with CVD films is a continuing problem in the integrated circuit manufacturing industry. Decreasing costs for most IC products forces increasingly efficient production and higher throughput of film deposition processes. What is needed is a method and apparatus for highly conformal CVD deposition and planarization after deposit and patterning of metal films.

Other prior art planarization processes include deposit-etch-deposit processes whereby a thin film of an insulating material is deposited then etched or polished from the surface to mechanically planarize the film followed by subsequent deposit and etch processes until a planar surface is achieved. As metal line pitch is reduced, the deposit-etch-deposit processes leave voids between the metal lines that cannot be filled.

Another prior process is spin on glass (SOG) planarization. SOG uses a suspension of glass particles in an organic carrier that can be spun onto a wafer in a thin film using conventional photoresist tools. The organic carrier is then driven off in thermal processing and the glass reflowed to fill spaces between metal lines. Spin on glass planarization is plagued with via poisoning caused by contaminants in the spin on glass and the organic carrier that cannot adequately be removed during subsequent processing.

U.S. Pat. No. 5,182,221 issued to Sato on Jan. 26, 1993 describes an ECR-CVD process in which etching and deposition are simultaneously performed. In one embodiment, the Sato deposition process is performed in a single step with carefully controlled conditions to provide a ratio of vertical to horizontal deposition rate that will fill high aspect ratio trenches. The Sato process provides high quality via fill at the cost of increased control and reduced deposition rates. Further, because of high equipment costs associated with the ECR-CVD processes, they have limited applicability and are not heavily used in IC manufacturing.

A need exists for a process for filling spaces between pattern metallization features with dielectric using existing equipment technology that provides high quality void free via filling.

3. Solution to the Problem

The above identified problems and others are solved by a planarization method using a thin film of expandable material applied to a surface of patterned metal features. The expandable material is treated at low temperature to cause a volume increase and fill the spaces between metal features. In this manner the spaces between metal features are filled in a void-free, seam free-manner at temperatures well below the melting point of the metal features.

SUMMARY OF THE INVENTION

Briefly stated, the present invention involves a planarization process for filling spaces between patterned metal features formed over a surface of a semiconductor substrate. The patterned metal features are preferably coated with a dielectric barrier. The dielectric barrier is coated with an oxidizable material such as silicon to a thickness about half the depth of the space between metallized features. The oxidizable layer is then plasma oxidized using an RF or ECR plasma at low temperature with an oxygen or ozone ambient. Alternatively, a material that expands during nitridization is substituted for the oxidizable material and the step of plasma oxidation is replaced by a step of plasma nitridization. The plasma oxidation or nitridization is continued until the expandable material is converted to a dielectric and has expanded to fill the space between patterned metal features. Optionally, the process can be followed by a mechanical or chemical mechanical planarization step.

DETAILED DESCRIPTION OF THE DRAWING

The present invention involves a method of filling spaces between patterned metal features on a semiconductor substrate with dielectric material. While the preferred embodiment is described in terms of metal lines formed directly on a semiconductor substrate, it will be apparent to those with skill in semiconductor processing that the patterned metal features in accordance with the present invention can be formed on a semiconducting, insulating, or conductive substrate. Similarly, the substrate may comprise one or more layers of semiconductor, conductor, or insulator material with electronic devices fabricated in one or more of the layers. While the present invention is particularly adapted to high aspect ratio patterned metal features, the present invention may be employed in any metallization scheme.

In order to form a dielectric layer between metal features, it is necessary to perform all processing at temperatures below the melting point of the metal. It is desirable to perform the processes well below the melting temperature in order to avoid diffusion of the metal into surrounding materials.

Figure 1:
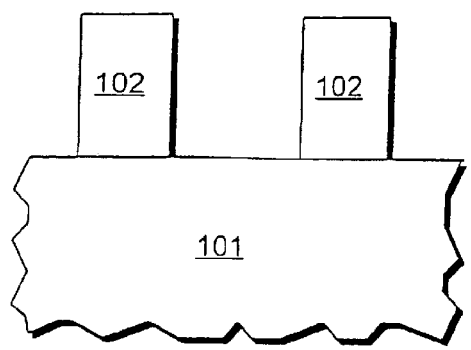
FIG. 1 illustrates a semiconductor wafer having patterned metallized features formed thereon.

FIG. 1 illustrates a substrate 101 which is preferably a semiconductor material but may comprise a single layer, or multilayer integrated circuit device. Typically, devices would be fabricated in substrate 101 and a metallization 102 provided to make electrical contact to the semiconductor devices. However, for ease of description semiconductor devices are not illustrated in substrate 101. The structures shown in FIG. 1 are not drawn to scale: a moderate aspect ratio structure is shown having an aspect ratio of about 1:1. The present invention is particularly useful in higher aspect ratio structures.

Figure 2:
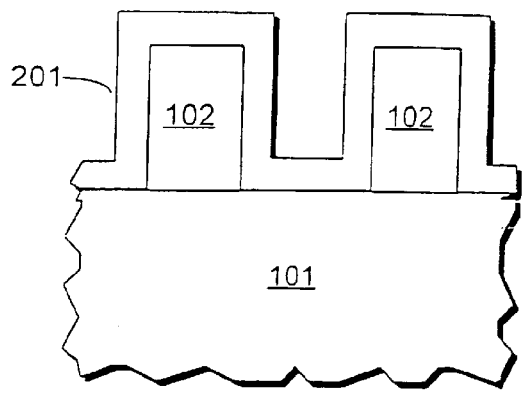
FIG. 2 illustrates the process in accordance with the present invention at an early stage of processing.

As shown in FIG. 2, metallized features and exposed portions of substrate 101 are conformally coated with an insulating layer 201. Insulating layer 201 may be silicon dioxide or silicon nitride or similar insulating material that serves as a barrier between metal 102, substrate 101, and any subsequent materials deposited. Insulating layer 201 can be applied by conventional low pressure chemical vapor deposition (LPCVD) or plasma enhanced chemical vapor deposition (PECVD). CVD processes are known to provide conformal coating of delicate high aspect ratio features and so are preferable to other methods of thin film formation.

Figure 3:
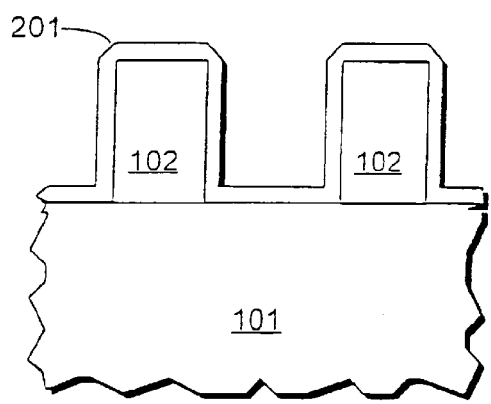
FIG. 3 illustrates the process in accordance with the present invention after further processing.

As shown on FIG. 3, insulating layer 201 is preferably facet etched in accordance with the method of the present invention. Facet etching is accomplished in a plasma reactor using well known processes. As can be seen by comparing FIG. 2 and FIG. 3, the facet etch step results in an overall thinning of insulating layer 201 as well as faceted edges in insulating layer 201 over corners of metal features 102. Faceted edges are easier to cover by subsequent deposition steps.

Figure 4:
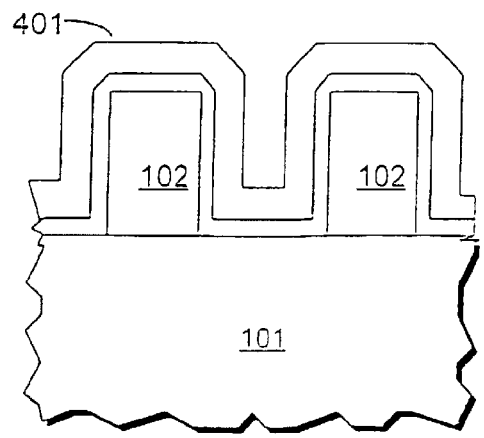
FIG. 4 illustrates the semiconductor substrate shown in FIG. 3 at a further stage in processing.

In FIG. 4, an oxidizable layer 401 is conformally deposited preferably using a CVD process. Oxidizable layer 401 comprises a material that expands during oxidation such as amorphous silicon. Polycrystalline silicon also could be used, but require higher deposition temperatures and affords little advantage over amorphous silicon. Any material that can be treated at low temperature to expand into an insulating fill material is an acceptable equivalent to the amorphous silicon used in oxidizable layer 401 of the preferred embodiment.

The thickness of oxidizable layer 401 is determined from the amount of expansion possible when oxidizable layer 401 is subsequently treated. In the preferred embodiment where oxidizable layer 401 comprises amorphous silicon, layer 401 should be about 50% of the total distance between patterned metal features 102. This is because the amorphous silicon will expand or swell to about two times its original volume once converted to $SiO_2$. Because a relatively thin layer is used (i.e., 0.15 micron to fill a 0.3 micron space), there is little problem with voids or seams during the deposition of oxidizable layer 401.

Figure 5:
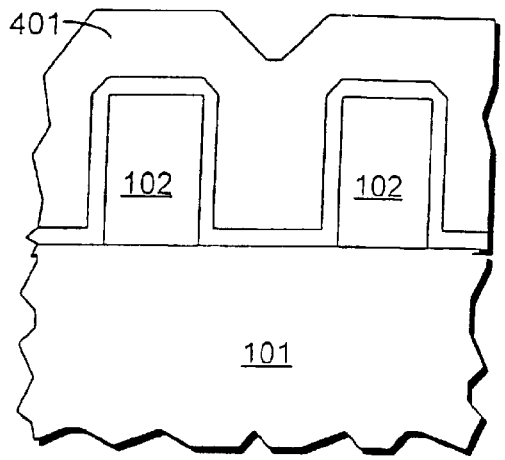
FIG. 5 illustrates the substrate shown in FIG. 4 at a later stage in planarization.

FIG. 5 illustrates a substrate at a later stage in processing. The substrate shown in FIG. 4 including oxidizable layer 401 are exposed to a plasma oxidation process. Plasma oxidation is a low temperature, high radio frequency power method of silicon oxidation used to form silicon dioxide films. Alternatively, electron cyclotron resonance (ECR) plasma processing can be used. Preferably, the plasma reactor includes magnetron electrodes to increase the power density of the plasma. Substrate temperature can be maintained below 300 degrees C. and preferably below 150 degrees C. Significantly, the plasma oxidation process is not a deposition process and requires only an oxygen ambient to react with the oxidizable layer 401. Because no deposition occurs, oxidizable layer 401 expands or swells to almost twice its volume during the oxidation process and does not create seams or voids between metal features 102.

Optionally, the substrate shown in FIG. 5 after the plasma oxidation process can be mechanically or chemical mechanically polished to further planarize the surface using known planarization techniques in combination with the method of the present invention. Because the filling between metal features 102 is substantially void and seam free, the chemical mechanical polish produces superior results.

Figure 6:
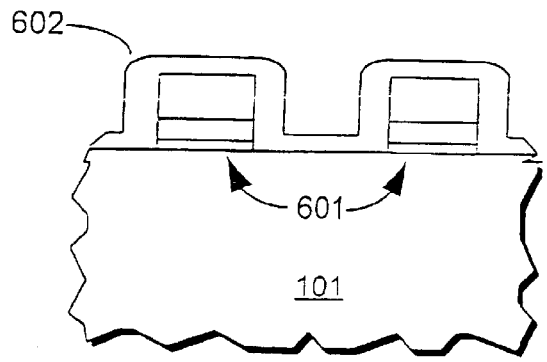
FIG. 6 shows a second embodiment of the method of the present invention.

A more general application of the method in accordance with the present invention is shown in FIG. 6 through FIG.

8. In this embodiment, the present invention is used to tailor surface contours but unlike the first embodiment, planarization is not the end goal. In FIG. 6, device features 601 protrude from the surface of substrate 101. In the case of FIG. 6, device features 601 comprise multiple layers of insulator and conductor used to form a gate electrode structure in a MOSFET process. The specific composition and layer arrangement are is not important for the present invention so long as it is understood that protruding device features 601 may comprise one or more layers of insulator, conductor, refractory metal silicide, semiconductor, or equivalent material.

Figure 7:
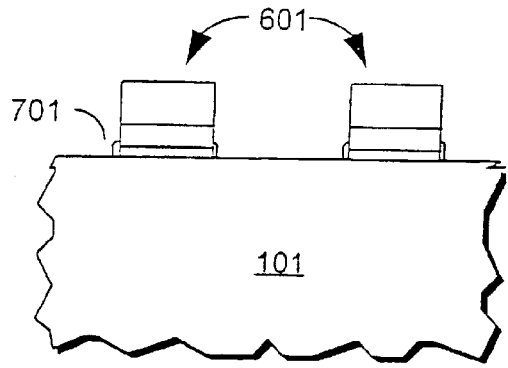
FIG. 7 illustrates the second embodiment of FIG. 6 at a later stage of processing.
Figure 8:
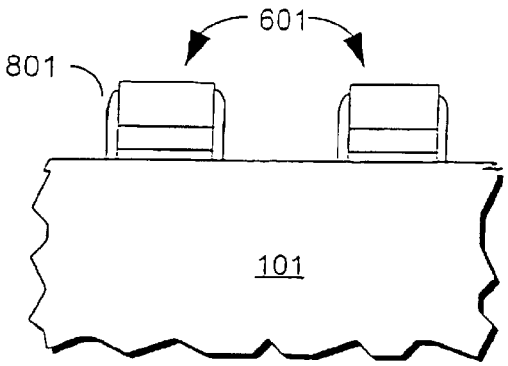
FIG. 8 shows the second embodiment after completion of the process in accordance with the present invention.

Many semiconductor processes involve forming a blanket deposited layer 602 over protruding device features 601. In particular, polysilicon or amorphous silicon are commonly used to form capacitor structures or device contacts. As shown in FIG. 7, layer 602 is patterned and etched to clear areas where layer 602 is not needed. This is done, for example, to expose source and drain regions on either side of a gate electrode. The removal process, however, often leave "stringers" 701 as a residue that are difficult to remove without damaging the structure or topology of protruding features 601.

Where layer 602 comprises an material that is expandable in a plasma oxidation or nitridization process, the present invention can be used to protect the topology and structure of protruding feature 601 by contouring (without planarizing) the protruding feature. In this embodiment, the structure shown in FIG. 7 is exposed to the plasma oxidation or nitridization process to convert stringers 701 to an insulating material such as sidewalls 801 shown in FIG. 8. Because low temperature plasma oxidation is used, the present invention provides the desirable contour with minimal impact on the thermal budget for various other device features. In the specific example of a gate electrode with polysilicon stringers, the stringer 701 causes gate leakage whereas the sidewall 801 both protects the gate electrode from undercutting and provides a better contour for further processing.

By now it is appreciated that a method for filling gaps between patterned device features with insulating material is provided. Using a deposited thin film of an expandable material allows the thin film to be conformally deposited onto the patterned metal features without voids or seams. A low temperature plasma oxidation converts the deposited layer into an insulating layer and causes it to increase in volume sufficiently to fill the gap between metal features. It is to be expressly understood that the claimed invention is not to be limited to the description of the preferred embodiment but encompasses other modifications and alterations within the scope and spirit of the inventive concept.

We claim:

1. A method of manufacturing an integrated circuit, the method comprising the steps of:
    (a) forming features on a substrate, the features protruding from the substrate to create creases adjacent the features;
    (b) depositing a layer of non-dielectric material over the features and the creases;
    (c) removing a portion of the layer of non-dielectric material, leaving stringers of the non-dielectric material in the creases; and
    (d) converting the stringers of non-dielectric material in the creases into a dielectric material, wherein the volume occupied by the stringer increases when converted into the dielectric material.

2. The method, as set forth in claim 1, wherein step (a) comprises the step of forming gate electrodes protruding from the substrate.

3. The method, as set forth in claim 1, wherein step (b) comprises the step of depositing a layer of silicon over the features and the creases.

4. The method, as set forth in claim 1, wherein step (c) comprises the step of etching the portion of the layer of non-dielectric material.

5. The method, as set forth in claim 1, wherein step (d) comprises the step of oxidizing the stringers.

6. The method, as set forth in claim 1, wherein step (d) comprises the step of nitridizing the stringers.

7. A method of manufacturing an integrated circuit, the method comprising the steps of:
    (a) forming features on a substrate, the features protruding from the substrate to create creases adjacent the features;
    (b) depositing a layer of non-dielectric material over the features and the creases;
    (c) removing a portion of the non-dielectric material from the creases using a given method, the given method leaving residual non-dielectric material in some of the creases; and
    (d) converting the residual non-dielectric material in the creases into a dielectric material, wherein the volume occupied by the dielectric material exceeds the volume occupied by the residual non-dielectric material.

8. The method, as set forth in claim 7, wherein step (a) comprises the step of forming gate electrodes protruding from the substrate.

9. The method, as set forth in claim 7, wherein step (b) comprises the step of depositing a layer of silicon over the features and the creases.

10. The method, as set forth in claim 7, wherein the given method comprises an etching method.

11. The method, as set forth in claim 7, wherein step (d) comprises the step of oxidizing the residual non-dielectric material.

12. The method as set forth in claim 7, wherein step (d) comprises the step of nitridizing the residual non-dielectric material.

* * * * *

UNITED STATES PATENT AND TRADEMARK OFFICE
CERTIFICATE OF CORRECTION

PATENT NO. : 6,777,346 B2 Page 1 of 1
DATED : August 17, 2004
INVENTOR(S) : Ravi Iyer It is certified that error appears in the above-identified patent and that said Letters Patent is hereby corrected as shown below:

<u>Column 1,</u>
Line 3, please insert the following paragraph immediately after the title:
-- GOVERNMENT LICENSE RIGHTS
The U.S. Government has a paid-up license in this invention and the rights in limited circumstances to require the patent owner to license others on reasonable terms as provided for by the terms of Contract No. MDA972-92-C-0054 awarded by the Advanced Research Projects Agency (ARPA). --

Signed and Sealed this

Sixteenth Day of November, 2004

JON W. DUDAS
*Director of the United States Patent and Trademark Office*